(12) United States Patent
Weisgerber

(10) Patent No.: US 9,343,271 B2
(45) Date of Patent: May 17, 2016

(54) APPARATUS FOR GENERATING THERMODYNAMICALLY COLD MICROWAVE PLASMA

(75) Inventor: Jonas Martin Weisgerber, Bonn (DE)

(73) Assignee: Martin Weisgerber, Bonn (DE)

( * ) Notice: Subject to any disclaimer, the term of this patent is extended or adjusted under 35 U.S.C. 154(b) by 235 days.

(21) Appl. No.: 14/238,744

(22) PCT Filed: Aug. 25, 2012

(86) PCT No.: PCT/DE2012/000865
§ 371 (c)(1),
(2), (4) Date: Aug. 19, 2014

(87) PCT Pub. No.: WO2013/029593
PCT Pub. Date: Mar. 7, 2013

(65) Prior Publication Data
US 2014/0361689 A1    Dec. 11, 2014

(30) Foreign Application Priority Data
Aug. 31, 2011   (DE) .......................... 10 2011 111 884

(51) Int. Cl.
*H01J 37/32*   (2006.01)
*H05H 1/46*    (2006.01)
*H01J 25/55*   (2006.01)

(52) U.S. Cl.
CPC .......... *H01J 37/32229* (2013.01); *H01J 25/55* (2013.01); *H01J 37/3244* (2013.01); *H05H 1/46* (2013.01); *H05H 2001/4622* (2013.01); *H05H 2240/10* (2013.01)

(58) Field of Classification Search
CPC .... H01J 37/32229; H01J 25/55; H05B 6/707; H05B 6/6402; H05H 1/46
USPC .......................... 315/111.21, 111.41, 111.71
See application file for complete search history.

(56) References Cited

U.S. PATENT DOCUMENTS

| | | |
|---|---|---|
| 3,384,783 A | 5/1968 | Olson, Jr. |
| 4,004,249 A | 1/1977 | Kikuchi |
| 4,588,965 A * | 5/1986 | Cook ...................... H01J 25/55 315/39.75 |
| 4,957,061 A | 9/1990 | Ando et al. |
| 5,159,241 A | 10/1992 | Kato et al. |
| 6,929,830 B2 | 8/2005 | Tei et al. |
| 7,106,004 B1 | 9/2006 | Greenwood |

* cited by examiner

Primary Examiner — Daniel D Chang

(57) ABSTRACT

The invention relates to an apparatus for generating a thermodynamically cold plasma under standard atmospheric conditions by injecting microwave radiation at a frequency of >3 GHz into a plasma chamber (6) and subsequent superposition of a plurality of waves with constructive interference. The microwave radiation, which is generated in specifically geometrically arranged, preferably cylindrical resonant cavities in an evacuated anode block, is coupled out via hollow waveguides (5) and fed to a separated plasma chamber (6). Using the combination of a plurality of microwave generators (7) it is possible to inject a multiplicity of microwaves into the plasma chamber (6). A material stream, for example a process gas, can be fed in through an inlet (9) at the upper side of the plasma chamber and be discharged through an outlet for example in nozzle form at the lower side of the plasma chamber (6) and be fed to the surface that is to be processed.

9 Claims, 4 Drawing Sheets

APPARATUS FOR GENERATING THERMODYNAMICALLY COLD MICROWAVE PLASMA

CROSS REFERENCE TO RELATED APPLICATIONS

This application claims the benefit of priority under 35 U.S.C. §119 of German Patent Application DE 10 2011 111 884 filed Aug. 31, 2011 and WIPO International Application WO 2013/029593 (PCT/DE2012/000865) filed Aug. 25, 2012, the entire contents of which are incorporated herein by reference.

DESCRIPTION OF THE INVENTION

1. Field of the Invention

The present invention describes a system for creating a thermodynamically cold plasma at standard atmospheric conditions inside a qualified plasma chamber by use of microwaves at high frequencies.

2. Background of the Invention

There are multiple applications of plasma right now throughout industry, medical range and other surface processing systems. Nearly all existing systems of industrial plasma currently used are in need of low pressure or even vacuum conditions. It would be preferable if these processes could also be used at standard atmospheric conditions.

From the invention DE 10 2008 018 827 B4 the creation of such a plasma working at standard atmospheric conditions is known, but by means of an electric arc discharge. Plasma creating systems based on said technology of electric arc discharge inhibit some drawbacks. The two most severe are for one the high temperature of the plasma created, which lies systematically based above 393 K, mostly even far above that, and by this forbids the application of these systems to temperature sensitive material. Second the short life time of the discharging electrode, because of the heavy wear by the continuous discharging, is to be mentioned. Furthermore these types of systems using electrical arc discharge need both financially as technologically extensive electrical power units for usage at typical voltages of 25 kV and typical frequencies of 35 kHz. Another disadvantage of the systems using electrical arc discharge is the disability of power-scaling.

Though the document DE 10 2004 060 068 B4 describes a plasma source for coating processes powered by microwaves and operating under standard atmospheric conditions, detailed examination of the text exhibits, as do any other scriptures on microwave driven plasma systems so far (e.g. US 2003/0203125 A1, EP 1 156 511 A1 or EP 2 080 424 B1), that this system too operates only in pressure environment below standard atmospheric conditions and furthermore does not represent a pure plasma application but a realisation of Plasma-Enhanced-Chemical-Vapour-Deposition or, as described by EP 0 420 117 A2, of Plasma-Enhanced-Physical-Vapour-Deposition.

Publication EP 0 674 369 B1 describes a gas laser driven by microwave radiation. But here the microwaves just serve for energy transportation and the excitation of the laser gas in fact results from electrical arc discharge at a distinct process point. Thus the system described in EP 0 674 369 B1 represents a kind of 'electrode less' electric arc discharge but no direct coupling of the microwave radiation with the process gas.

Another invention of a gas laser, using the same principles just mentioned, is described in the publication U.S. Pat. No. 4,004,249 A. Here also an electrical spark-over drives the excitation of a special laser-gas ($CO_2$+He+$N_2$) into laser function. By concentric arrangement of multiple microwave guides with terminal electric arc discharge a higher energy-density and by this a higher population inversion in the laser-gas can be accomplished.

The necessity of low a pressure or even vacuum environment for a successful transmission of the microwaves (EP 0 359 336 B1) or application of a microwave driven plasma follows from the too low energy-density of the plasma generating microwave used, whose typical frequency is 2.45 GHz; as is described by publications e.g. U.S. Pat. No. 4,004, 249 A or EP 0 674 369 B1. Also coupling of multiple microwaves by superposition alone, as described in JP 2001 192 840 A, does not suffice to generate a plasma, but a special low-pressure process-gas (z.B. $CO_2$+He+$N_2$) has to be used inside a closed process-chamber.

Furthermore the necessity of a low-pressure or even vacuum environment gives rise for extensive burden and handicap on the industrial use of microwave driven plasma systems. Because besides a non-continuous production-process, extensive operating expenditures for the low-pressure or vacuum systems and the plasma-chambers as well as the periodical purification of those are inherent to these systems. If it would be to include these systems into a continuous production-process, a non-economical sequence of locks and low-pressure-chambers had to be installed. Beyond that all known microwave based plasma systems are bulky and heavy devices with all correspondent drawbacks for industrial application.

SUMMARY OF THE INVENTION

Function of the present invention described here is the realisation of an apparatus for creating a plasma in standard atmospheric environment, scalable both in power and application area, which, by use of microwave radiation as driving force, is thermodynamically cold, while the apparatus simultaneously is most compact and lightweight and does not need technological or financial extensive components. According to the present invention this function is fulfilled by an apparatus which exhibits the features of the claims presented in this document.

Embodiment of the present invention of microwave driven plasma source is, that in at least one bodily separated microwave source generated microwaves with high energy density are fed by means of wave guides into a plasma chamber, which is open to the surrounding, and superposed therein. The plasma chamber having a polygonal cross-section, which being a circle in the limiting case $$\lim_{n \to \infty}$$

of a n-gon. For the case of a polygonal cross-section the wave guides enter the plasma chamber orthogonal relative to the addressing side faces of the polygon, in case of a circular plasma chamber the wave guides enter in radial manner. By means of applicable 'windows' being transparent for microwaves, e.g. fused quartz, the microwaves exit the wave guides and disperse inside the plasma chamber. To minimize feedback of the microwaves inside the plasma chamber on the wave guides, the exit faces of the wave guides are set back relative to the inner face of the plasma chamber.

By means of an opening in the upper face of the plasma chamber a material stream, preferable gaseous as e.g. surrounding air or any process gas liked, can be introduced into the plasma chamber. This material stream traverses the plasma chamber and will be set into plasma state by excitation before leaving the plasma chamber through a second opening in the bottom face of the plasma chamber and being fed to the desired application.

The embodiment of this lower opening in the bottom face of the plasma chamber is changeable and use-oriented designed, e.g. in form of circular nozzle. By different geometrically designed nozzles the plasma stream can be affected fluid dynamically and hereby optimized for the particular application, e.g. by different cross sections of flow.

The preferable gaseous material stream can contain micro particles of further substances, so to be an aerosol. These micro particles contained in the material stream are also shifted in excited states while traversing the plasma chamber and thereafter used for particular coating processes. No principle constraint to particular substances contained in the material stream is given; in principle all known substances can be administered. It depends on the application, which substances can reasonable be used. Possible application comprise coating by electrical conducting structures (e.g. copper) on synthetic materials or glass.

For generating a plasma at standard atmospheric conditions high energy densities are needed. According to the present invention this will be accomplished by use of microwaves of frequency above 3 GHz, preferably of 30 GHz.

The best industrial applicability of any apparatus is reached by low weight and as small scale as possible. According to the present invention this economical significant requirement is fulfilled by the particular design of the microwave generating apparatus.

Said microwave generating apparatus operates analogous to the principles of a magnetron, but only the particular shape and arrangement of the resonant cavities according to the present invention enables said functioning.

The following description of the apparatus uses the three dimensional cylindrical coordinate system comprising the elements: radius vector r, azimuthal vector φ and height vector z.

An anode made of metal, preferable copper, features multiple, preferable twenty, concentric to the centre axis of said anode and respective to the azimuthal direction equidistant distributed cavities functioning as electromagnetic resonant cavities. Said resonant cavities are by themselves cylindrical in shape with their respective axis of symmetry positioned at their respective centre point and oriented parallel to the azimuthal direction. Said resonant cavities having a radius of less than 1 cm, preferable of 3.87 mm and having a height of less than 1 cm, preferable of 1.5 mm.

The arbitrary, preferable cylindrical, formed anode exhibits a cavity along the z axis at the centre point which has an opening to the top side. Said resonant cavities are connected to said central cavity of said anode by means of radial running hollow conductors.

Because of this particular arrangement and shape of said resonant cavities the high-capacity generation of microwaves with simultaneous small foot-print and mass is possible. That way the volume of said microwave generator is less than 10 cm$^3$ and the weight is less than 100 g (excluding electron source and guiding magnets). Furthermore because of the concentric arrangement the microwave excitation is thermodynamically stable, i.e. thermal expansion has no influence on the phasing of the microwaves of the individual resonant cavities.

Coupling out of the microwaves happens by external oriented hollow conductors from least one or multiple, preferable three, resonant cavities, which are spaced an uneven number of resonant cavities, i.e. between two extraction conductors an uneven number of resonant cavities are positioned.

Depending on the shape of the plasma chamber the hollow conductors follow different curved trajectories to said plasma chamber.

A further particular embodiment of the invention comprises multiple, preferable four, of said microwave generators, of which in each case multiple, preferable three, hollow conductors carry the generated microwave to said plasma chamber.

The energetic power of the plasma apparatus can easily be increased to the application needs by adding a multiple of said microwave generators to the plasma chamber.

A further particular embodiment of the invention is given by a quadrangular shaped plasma chamber with equally distributed couplings of microwave input. By this generally lozenge shape of the plasma chamber a particular plasma with, from the edge to the centre, variable intensity for specific applications can be generated.

Extraction of the plasma on the bottom of the plasma chamber can take place by slot or circular type nozzles in different arrangements.

A further particular embodiment of the invention is given by a rectangular shaped plasma chamber with a least on the long side, generally on all sides, equally distributed couplings of microwave inputs. Hereby a uniform two-dimensional intensity of the plasma can be arranged. Extraction of the plasma on the bottom of the plasma chamber can take place by slot or linear arranged circular nozzles.

BRIEF DESCRIPTION OF THE DRAWINGS

FIG. (1) shows a cutout of the microwave generator.
FIG. (2) shows the arrangement of a single microwave generator with a plasma chamber.
FIG. (3) shows the arrangement of four microwave generators with a plasma chamber with circular cross section as is used for selective application.
FIG. (4) shows the arrangement of multiple microwave generators with a plasma chamber of rectangular cross section, as is used for two-dimensional applications.

DETAILED DESCRIPTION OF THE DRAWINGS

Figure 1:
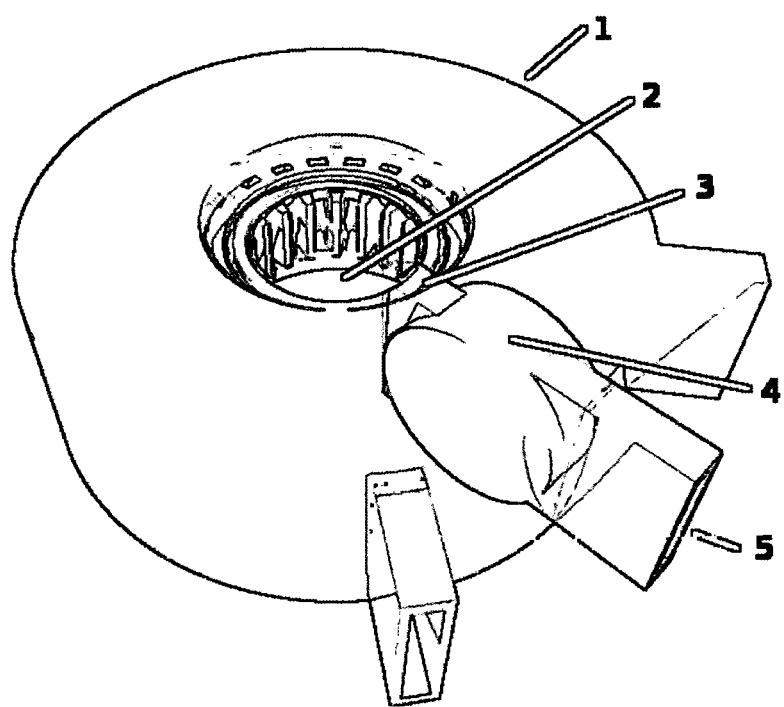
Figure 2:
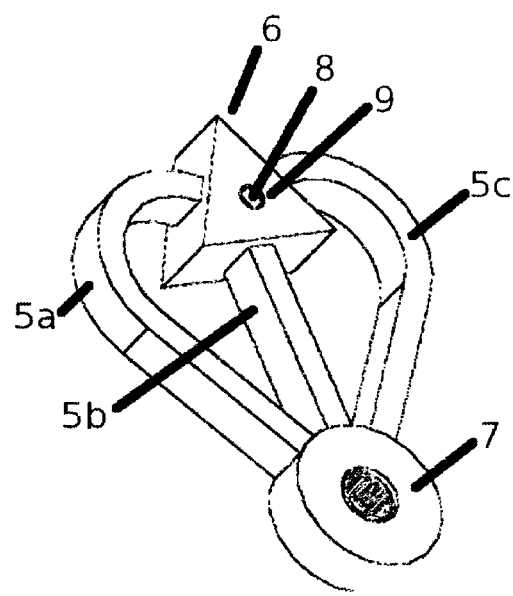
Figure 3:
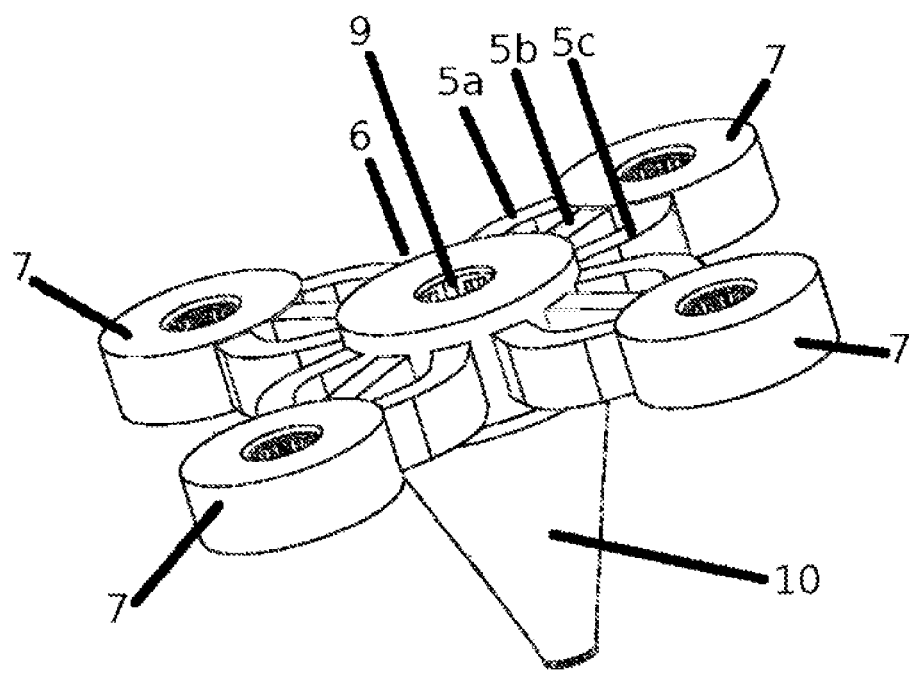
Figure 4:
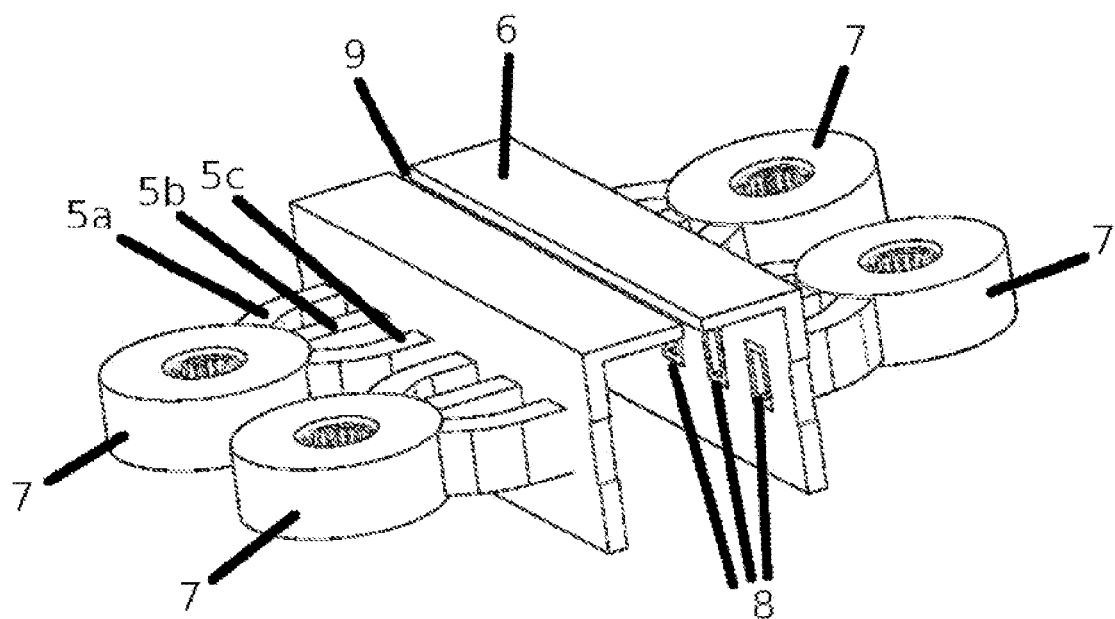

FIG. (1) shows a cutout of the microwave generator. The, in this embodiment of the present invention, circular shaped anode (1) comprises a cavity (2) along the centre axis, within which the electron source (not shown) is positioned. Above and below the anode the conducting magnets (not shown), producing the circular motion of the electrons, are positioned. Expanding from the centre cavity of the anode hollow conductors (3) lead to the individual resonant cavities (4), arranged concentric around the centre axis of the anode. At least from one of said resonant cavities a further hollow conductor (5) leads the microwaves towards the plasma chamber.

FIG. (2) shows a possible embodiment of the present invention of the plasma chamber (6) with only one microwave generator (7). The plasma chamber of this embodiment of the invention is of triangular shape with the microwaves fed into said plasma chamber by three differently curved hollow conductors (5a), (5b) and (5c) orthogonal passing through the face sides of said plasma chamber. The microwaves exit the hollow conductors through 'windows' (8) which are transparent for microwaves and propagate into the plasma chamber. Flowing through the opening (9) on top of the plasma chamber a material stream, e.g. process gas or aerosol, can enter the plasma chamber. The opening on the bottom of the plasma chamber can be made of a nozzle like shape to adapt for optimized application.

FIG. (3) shows a possible embodiment of the present invention of the plasma chamber (6) with four microwave generators (7). Out of every individual microwave generator three hollow conductors (5a), (5b) and (5c) lead the microwaves into said plasma chamber. Said plasma chamber can be of circular cross-section as shown in FIG. (3) or of polygonal cross-section (not shown). If shown embodiment with four microwave generators as in FIG. (3) would comprise a plasma chamber of polygonal cross-section, the cross-section would be in shape of a dodekaedon. In case of an embodiment (not shown) with three microwave generators the cross-section of the polygonal plasma chamber would be in shape of a nonagon, and so forth. In general description of a n-gon, the following correlation between the number n of the cross-sectional n-gon with the number i of microwave generators and number of j microwave extracting hollow conductors per microwave generator is given by $$n = i \cdot j \quad (1)$$

Shown in FIG. (3) a material stream can be introduced into the plasma chamber by an opening (9) on top of said plasma chamber. By means of the mountable nozzle like structure (10) the excited material stream is fed to the application in an optimal manner.

FIG. (4) shows a possible embodiment of the present invention with a rectangular plasma chamber of which two sides are longer than the other two sides. Apparatus of this form are for e.g. two-dimensional applications used for web material. On both longer sides of the rectangle, in general on all sides, microwave generators (7) are equally distributed. By means of hollow conductors (5a), (5b) and (5c) the microwaves are extracted from the microwave generators and fed into said plasma chamber. The vis-á-vis positioned microwave transparent feed-ins (8), e.g. 'windows' made of fused quartz, can be arranged shifted or aligned to each counterpart. By means of an opening (9) also this embodiment of the present invention can be supplied with a material stream. On the bottom of the rectangular plasma chamber a use-oriented nozzle like shape (slot nozzle or line of circular nozzles) can be attached.

What is claimed is:

1. Apparatus for generating a plasma by microwaves, which are generated by multiple resonant cavities (4), arranged concentrically around the centre axis of an anode block, which axis corresponds to the z-axis of a cylindrical coordinate system, and coupled out of one or more resonant cavities, separated by an uneven number of resonant cavities, via at least one or more hollow waveguides (5) comprising:
    said resonant cavities are distributed inside an evacuated, electricity conducting anode block (1) and
    said resonant cavities are of cylindrical form and
    said resonant cavities have their axis of symmetry oriented parallel to the azimuthal coordinate of the cylindrical coordinate system
        whereat any one of
    said resonant cavities is connected to the excavation (2) along the centre axis of said anode block via rectangular hollow conductors (3) and
    said coupled out microwaves are injected into a separated plasma chamber (6) and by subsequent superposition of waves with constructive interference
    said microwaves generate a plasma under standard atmospheric conditions.

2. An apparatus in accordance with claim 1 comprising:
    said cylindrically shaped resonant cavities (4) having a radius of less than 1 cm and
    said cylindrically shaped resonant cavities having a height of less than 1 cm and
    said cylindrically shaped resonant cavities generating a microwave with frequency of more than 3 GHz when in resonance.

3. An apparatus in accordance with claim 1 comprising:
    multiple, at least two, of
    said microwave generating apparatus (7) being arranged around a plasma chamber (6) with polygonal, in the limiting case $$\lim_{n \to \infty}$$

of a n-gon circular, cross-section so that
    said microwaves, fed into the plasma chamber (6) via hollow waveguides (5), superpose with constructive interference whereat a material stream is fed through an inlet (9) into said plasma chamber (6) and
    the material stream is be discharged through an outlet on the opposite side.

4. An apparatus in accordance with claim 1 comprising:
    said plasma chamber (6) is coated with a partial or full microwave reflective material or
    said plasma chamber (6) is coated with a partial of full microwave absorbing material.

5. An apparatus in accordance with claim 1 comprising:
    an outlet (10) of said plasma chamber (6) being formed by a changeable nozzle, whose particular geometric shape generates different flow profiles.

6. An apparatus in accordance with claim 1 comprising:
    said cross-section of the plasma chamber (6) forms a quadrangle, at whose sides at least one or more microwave generating apparatus (7) in accordance with claim 1 are attached respectively so that
    said microwaves are fed uniformly arranged along each side into said plasma chamber via hollow waveguides (5) and
    said microwaves subsequent interfere with each other.

7. An apparatus in accordance with claim 1 comprising:
    said changeable nozzle (10) is formed as slot-nozzle.

8. An apparatus in accordance with claim 1 comprising:
    said changeable nozzle (10) is formed as linear sequence of round nozzles instead of a slot nozzle.

9. An apparatus in accordance with claim 1 comprising:
    said plasma chamber (6) with polygonal cross-section contains stream forming parts
        made of microwave reflective material in such a way, that said stream forming parts
        on the one hand guide the material stream through said plasma chamber and
        on the other hand focus said microwave onto the material stream.

* * * * *